US011355207B2

(12) United States Patent
Lee et al.

(10) Patent No.: US 11,355,207 B2
(45) Date of Patent: Jun. 7, 2022

(54) MEMORY DEVICE AND METHOD OF OPERATING THE SAME

(71) Applicant: SK hynix Inc., Icheon-si (KR)

(72) Inventors: Dong Uk Lee, Icheon-si (KR); Hae Chang Yang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/003,617

(22) Filed: Aug. 26, 2020

(65) Prior Publication Data

US 2021/0304831 A1    Sep. 30, 2021

(30) Foreign Application Priority Data

Mar. 25, 2020  (KR) .................. 10-2020-0035955

(51) Int. Cl.
*G11C 16/34* (2006.01)
*G11C 16/16* (2006.01)
*G11C 16/08* (2006.01)
*G11C 16/24* (2006.01)
*G11C 16/26* (2006.01)
*G11C 16/30* (2006.01)

(52) U.S. Cl.
CPC .......... *G11C 16/3445* (2013.01); *G11C 16/08* (2013.01); *G11C 16/16* (2013.01); *G11C 16/24* (2013.01); *G11C 16/26* (2013.01); *G11C 16/30* (2013.01)

(58) Field of Classification Search
CPC ..... G11C 16/3445; G11C 16/08; G11C 16/16; G11C 16/24; G11C 16/26
USPC ..................................... 365/185.22
See application file for complete search history.

(56) References Cited

U.S. PATENT DOCUMENTS

| 5,954,828 A * | 9/1999 | Lin ................. G11C 29/88 714/723 |
| 2002/0181301 A1* | 12/2002 | Takahashi ............ G11C 8/18 365/200 |
| 2005/0265081 A1* | 12/2005 | Tran ................ G11C 16/3468 365/185.29 |
| 2006/0036803 A1* | 2/2006 | Edan ................ G11C 16/20 711/103 |
| 2007/0138535 A1* | 6/2007 | Higashitani ....... H01L 27/11529 257/315 |

(Continued)

FOREIGN PATENT DOCUMENTS

| KR | 1020120019682 A | 3/2012 |
| KR | 1020120034828 A | 4/2012 |

*Primary Examiner* — Ly D Pham
(74) *Attorney, Agent, or Firm* — William Park & Associates Ltd.

(57) ABSTRACT

A memory device, and a method of operating the memory device, includes a memory block configured to include a plurality of memory cells that are stacked to be spaced apart from each other on a substrate and to include word lines coupled to the plurality of memory cells, and bit lines and a source line coupled to both ends of strings including the plurality of memory cells, and peripheral circuits configured to perform an erase operation on the memory block, wherein the peripheral circuits are configured to perform the erase operation on the plurality of memory cells included in the memory block, and thereafter perform a defect detection operation on memory cells selected from among the plurality of memory cells depending on sizes of the plurality of memory cells.

18 Claims, 14 Drawing Sheets

(56) References Cited

U.S. PATENT DOCUMENTS

| | | | | |
|---|---|---|---|---|
| 2007/0230263 | A1* | 10/2007 | Sakakibara | G11C 29/789 365/49.15 |
| 2008/0109594 | A1* | 5/2008 | Grossgold | F01L 1/34 711/103 |
| 2014/0270475 | A1* | 9/2014 | Huang | G06T 7/001 382/149 |
| 2014/0293703 | A1* | 10/2014 | Jeong | H01L 23/5226 365/185.17 |
| 2015/0049549 | A1* | 2/2015 | Asaoka | G11C 29/883 365/185.12 |
| 2015/0149855 | A1* | 5/2015 | Alhussien | G06F 11/1012 714/758 |
| 2015/0287479 | A1* | 10/2015 | Nam | G11C 29/025 714/721 |
| 2016/0283308 | A1* | 9/2016 | Earhart | G11C 16/10 |
| 2017/0256328 | A1* | 9/2017 | Ouyang | G11C 7/06 |
| 2018/0166461 | A1* | 6/2018 | Shim | H01L 27/11582 |
| 2020/0294607 | A1* | 9/2020 | Maejima | G11C 16/0483 |
| 2020/0365211 | A1* | 11/2020 | Nam | G11C 11/5635 |

* cited by examiner

FIG. 8

|  | ST11 | ST21 | ST31 | ST41 | ST51 | ST61 | ST71 | ST81 | ST91 | ST101 | ... |
|---|---|---|---|---|---|---|---|---|---|---|---|
| WL12 | | | | | | | | | | | |
| WL11 | | | | | | | | | | | |
| WL10 | | | | | | | | | | | |
| WL9 | | | | | | | | | | | |
| WL8 | | | | | | | | | | | |
| WL7 | O | O | O | O | O | O | O | O | O | O | ~41b |
| WL6 | | | | | | | | | | | |
| WL5 | | | | | | | | | | | |
| WL4 | | | | | | | | | | | |
| WL3 | | | | | | | | | | | |
| WL2 | | | | | | | | | | | |
| WL1 | O | O | O | O | O | O | O | O | O | O | ~41a |

|  | ST11 | ST21 | ST31 | ST41 | ST51 | ST61 | ST71 | ST81 | ST91 | ST101 | ... |
|---|---|---|---|---|---|---|---|---|---|---|---|
| WL12 |  |  |  |  |  |  |  |  |  |  |  |
| WL11 |  |  |  |  |  |  |  |  |  | O |  |
| WL10 |  |  |  |  |  |  |  |  | O |  |  |
| WL9 |  |  |  |  |  |  |  | O |  |  |  |
| WL8 |  |  |  |  |  |  | O |  |  |  |  |
| WL7 | O | O | O | O | O | O | O | O | O | O |  |
| WL6 |  |  |  |  |  | O |  |  |  |  |  |
| WL5 |  |  |  |  | O |  |  |  |  |  |  |
| WL4 |  |  |  | O |  |  |  |  |  |  |  |
| WL3 |  |  | O |  |  |  |  |  |  |  |  |
| WL2 |  | O |  |  |  |  |  |  |  |  |  |
| WL1 | O | O | O | O | O | O | O | O | O | O |  |

FIG. 10

| | ST11 | ST21 | ST31 | ST41 | ST51 | ST61 | ST71 | ST81 | ST91 | ST101 | ... |
|---|---|---|---|---|---|---|---|---|---|---|---|
| WL12 | O | O | O | O | O | O | O | O | O | O | ~42b |
| WL11 | | | | | | | | | | | |
| WL10 | | | | | | | | | | | |
| WL9 | | | | | | | | | | | |
| WL8 | | | | | | | | | | | |
| WL7 | O | O | O | O | O | O | O | O | O | O | ~41b |
| WL6 | O | O | O | O | O | O | O | O | O | O | ~42a |
| WL5 | | | | | | | | | | | |
| WL4 | | | | | | | | | | | |
| WL3 | | | | | | | | | | | |
| WL2 | | | | | | | | | | | |
| WL1 | O | O | O | O | O | O | O | O | O | O | ~41a |

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0035955, filed on Mar. 25, 2020, in the Korean Intellectual Property Office, the entire disclosure of which is incorporated herein by reference.

BACKGROUND

1. Technical Field

Various embodiments of the present disclosure generally relate to a memory device and a method of operating the memory device, and more particularly, to a memory device which can detect defects occurring in the memory device after a product including the memory device has been shipped, and a method of operating the memory device.

2. Related Art

Memory devices may include volatile memory, in which stored data is lost when the supply of power is interrupted, or nonvolatile memory, in which stored data is retained even when the supply of power is interrupted.

Nonvolatile memory devices generally require the implementation of large capacity and high integration for use with portable electronic devices, such as mobile phones and notebook computers.

As the structure of two-dimensional (2D) nonvolatile memory devices including memory cells formed on a substrate as a single layer reaches a physical scaling limit, three-dimensional (3D) nonvolatile memory devices including memory cells vertically stacked on a substrate are being developed.

A nonvolatile memory device having a 3D structure is advantageous to high integration, but an interval between elements constituting the memory device is narrow, and thus the reliability of the memory device is inevitably deteriorated.

SUMMARY

A memory device in accordance with an embodiment of the present disclosure includes a memory block including a plurality of memory cells that are stacked to be spaced apart from each other on a substrate, including word lines coupled to the plurality of memory cells, and including bit lines and a source line coupled to both ends of strings which include the plurality of memory cells. The memory device also includes peripheral circuits configured to perform an erase operation on the memory block. The peripheral circuits are configured to perform the erase operation on the plurality of memory cells included in the memory block, and thereafter to perform a defect detection operation on memory cells selected from among the plurality of memory cells depending on sizes of the plurality of memory cells.

A method of operating a memory device in accordance with an embodiment of the present disclosure includes performing an erase operation and a block verify operation on a memory block. The method also includes performing, when the block verify operation passes, a defect detection operation on pages selected from among a plurality of pages included in the memory block. The method further includes processing, when the block verify operation fails or the defect detection operation fails until a number of erase operations reaches a maximum erase count, the memory block as a bad block.

BRIEF DESCRIPTION OF THE DRAWINGS

FIGS. 8 to 10 are diagrams illustrating a detection operation performed on selected pages according to an embodiment of the present disclosure.

DETAILED DESCRIPTION

Various embodiments of the present disclosure are directed to a memory device that can detect defects occurring in the memory device, and a method of operating the memory device.

Figure 1:
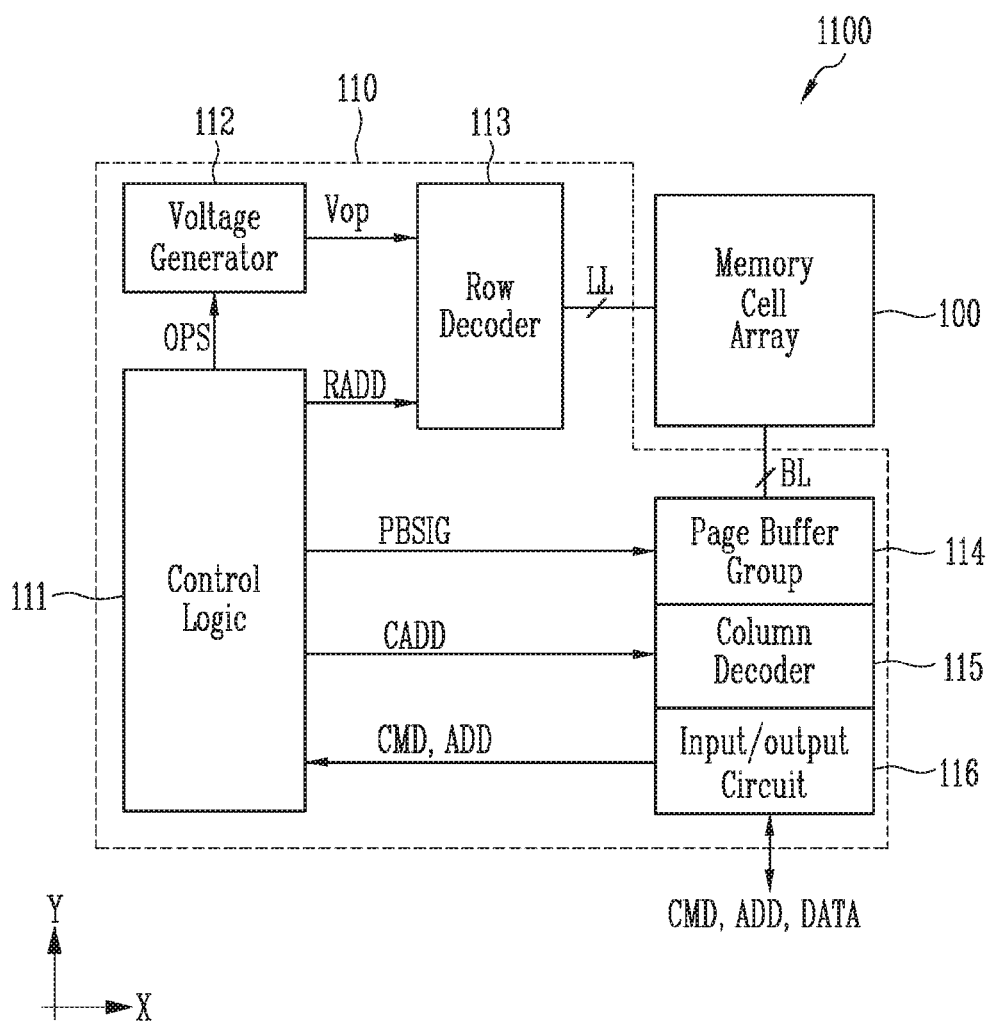
FIG. 1 is a diagram illustrating a memory device according to an embodiment of the present disclosure.

FIG. 1 is a diagram illustrating a memory device according to an embodiment of the present disclosure.

Referring to FIG. 1, a memory device 1100 may include a memory cell array 100 in which data may be stored, and peripheral circuits 110 which may perform a program operation, a read operation, or an erase operation of the memory cell array 100.

The memory cell array 100 may include a plurality of memory blocks, each including nonvolatile memory cells. Local lines LL may be coupled to each of the memory blocks, and bit lines BL may be coupled in common to the memory blocks.

The peripheral circuits 110 may include control logic 111, a voltage generator 112, a row decoder 113, a page buffer group 114, a column decoder 115, and an input/output circuit 116.

The control logic 111 may control the voltage generator 112, the row decoder 113, the page buffer group 114, the column decoder 115, and the input/output circuit 116 in response to a command CMD and an address ADD. For example, the control logic 111 may output an operation signal OPS and a page buffer control signal PBSIG in response to the command CMD, and may output a row address RADD and a column address CADD in response to the address ADD. The control logic 111 may include software which executes various operations in response to the command CMD, and hardware which outputs signals required for various operations. That is, the control logic 111 may be implemented as hardware, software, or a combination of hardware and software. For example, the control logic 111 may be a control logic circuit operating in accordance with an algorithm and/or a processor executing control logic code. In the present embodiment, the control logic 111 may control the peripheral circuits 110 so that a defect detection operation is performed when an erase operation is performed in response to an erase command CMD.

The voltage generator 112 may supply operating voltages to word lines and a source line. For example, the voltage generator 112 may generate operating voltages Vop required for a program operation, a read operation or an erase operation in response to the operation signal OPS, and may selectively output the generated voltages to the word lines and the source line. For example, the voltage generator 112 may generate and output the operating voltages Vop, such as a program voltage, a read voltage, an erase voltage, and a pass voltage.

The row decoder 113 may transfer the operating voltages Vop to a selected memory block through the local lines LL in response to the row address RADD.

The page buffer group 114 may include a plurality of page buffers coupled to the bit lines BL. The page buffer group 114 may store data by receiving voltages or currents changed depending on selected memory cells through the bit lines BL. For example, the page buffer group 114 may temporarily store data in response to the page buffer control signal PBSIG during a program operation or a read operation.

The column decoder 115 may transfer data between the page buffer group 114 and the input/output circuit 116 in response to the column address CADD.

The input/output circuit 116 may receive the command CMD and the address ADDR from an external device, and may transmit the command CMD the address ADD to the control logic 111. The input/output circuit 116 may transmit data DATA received from the external device to the column decoder 115 during a program operation, and may output the data DATA, received from the column decoder 115, to the external device during a read operation.

Figure 2:
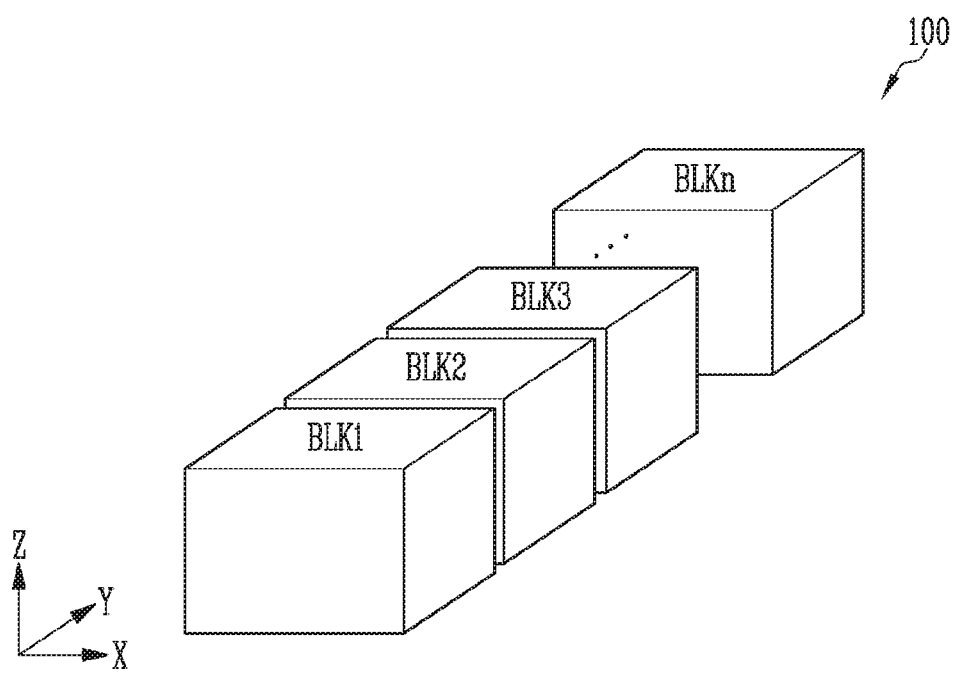
FIG. 2 is a diagram illustrating in detail a memory cell array illustrated in FIG. 1.

FIG. 2 is a diagram illustrating in detail the memory cell array illustrated in FIG. 1.

Referring to FIG. 2, when the memory cell array 100 includes memory blocks BLK1 to BLKn formed in a 3D structure, the memory blocks BLK1 to BLKn may be arranged in a Y direction. The Y direction may be a direction in which bit lines (e.g., BL of FIG. 1) extend.

Although, in FIG. 2, the memory cell array 100 is illustrated as having a structure including one plane, the memory cell array 100 may also include a plurality of planes. When the memory cell array 100 includes a plurality of planes, the plurality of planes may be arranged in an X direction, and memory blocks included in each of the planes may be arranged in a Y direction within the corresponding plane.

Figure 3:
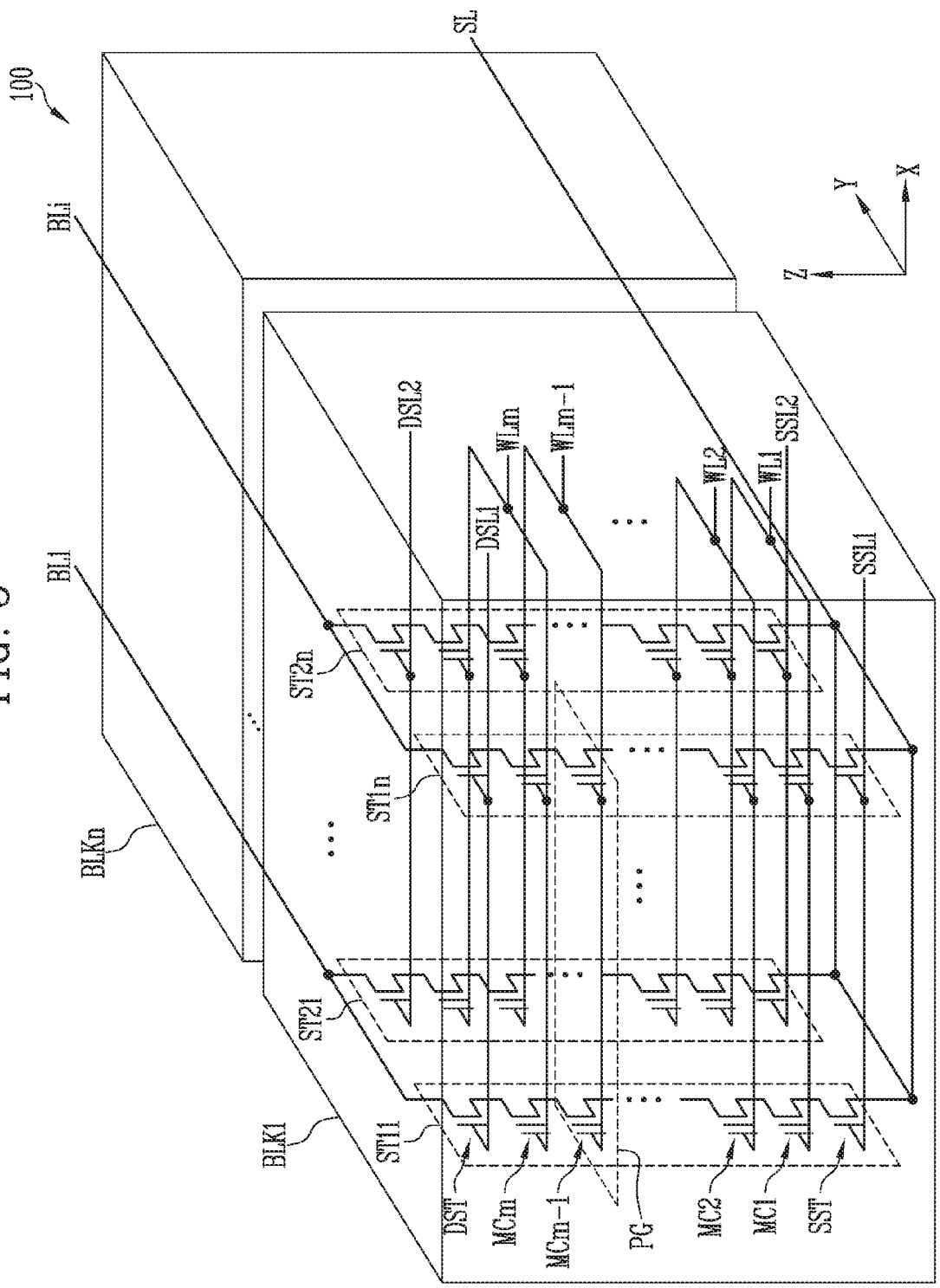
FIG. 3 is a diagram illustrating in detail a memory block illustrated in FIG. 2.

FIG. 3 is a diagram illustrating in detail the memory blocks illustrated in FIG. 2.

Referring to FIG. 3, the memory cell array 100 may include a plurality of memory blocks BLK1 to BLKn. In FIG. 3, for better understanding, the internal configuration of the first memory block BLK1 is illustrated, and the remaining blocks BLK1 to BLKn may be configured in the same way as the first memory block BLK1.

The first memory block BLK1 may include a plurality of strings ST11 to ST1$n$ and ST21 to ST2$n$. Each of the strings ST11 to ST1$n$ and ST21 to ST2$n$ may extend along a vertical direction (e.g., Z direction). In the first memory block BLK1, n strings may be arranged in a row direction (e.g., X direction). Although, in FIG. 3, two strings are illustrated as being arranged in a column direction (e.g., Y direction), this embodiment is given for convenience of description, and three or more strings may be arranged in the column direction (e.g., Y direction) in other embodiments.

Each of the strings ST11 to ST1$n$ and ST21 to ST2$n$ may include at least one source select transistor SST, first to m-th memory cells MC1 to MCm, and at least one drain select transistor DST.

The source select transistor SST of each string may be coupled between a source line SL and the memory cells MC1 to MCm. Source select transistors of strings arranged in the same row may be coupled to the same source select line. The source select transistors of the strings ST11 to ST1$n$ arranged in a first row may be coupled to a first source select line SSL1. The source select transistors of the strings ST21 to ST2$n$ arranged in a second row may be coupled to a second source select line SSL2. In an embodiment, the second source select line SSL2 may be coupled to or decoupled from the first source select line SSL1. In other embodiments, the source select transistors of the strings ST11 to ST1$n$ and ST21 to ST2$n$ may be coupled in common to a single source select line.

The first to m-th memory cells MC1 to MCm in each string may be coupled in series between the source select transistor SST and the drain select transistor DST. Gates of the first to m-th memory cells MC1 to MCm may be coupled to first to m-th word lines WL1 to WLm, respectively.

In an embodiment, some of the first to m-th memory cells MC1 to MCm may be used as dummy memory cells. The dummy memory cells, which refer to cells in which valid data is not stored, may be used to stably control the voltages or currents of the strings. Because the dummy memory cells are generally used cells, a detailed description thereof will be omitted.

A group of memory cells that are included in different strings arranged in an X direction and that are coupled to the same word line may be a page (PG). In the memory device, each of a program operation, a read operation, and a verify operation may be performed on a page basis. For example, a verify operation performed during the program operation may be performed on a page basis, and a verify operation performed during the erase operation may be performed on a memory block basis or a page basis.

The drain select transistor DST of each string may be coupled between the corresponding bit line and the memory cells MC1 to MCm. The drain select transistors DST of strings arranged in the row direction may be coupled to a drain select line extending along the row direction. The drain select transistors DST included in the strings ST11 to ST1$n$ in a first row may be coupled to a first drain select line DSL1, and the drain select transistors DST included in the strings ST21 to ST2$n$ in a second row may be coupled to a second drain select line DSL2.

A defect detection operation according to the present embodiment may be performed during an erase operation, and may be performed on a word line basis in strings coupled to different drain select lines. Further, in other embodiments of the present disclosure, the defect detection operation may be performed on a string basis. A detailed defect detection operation will be described in detail later.

Figure 4:
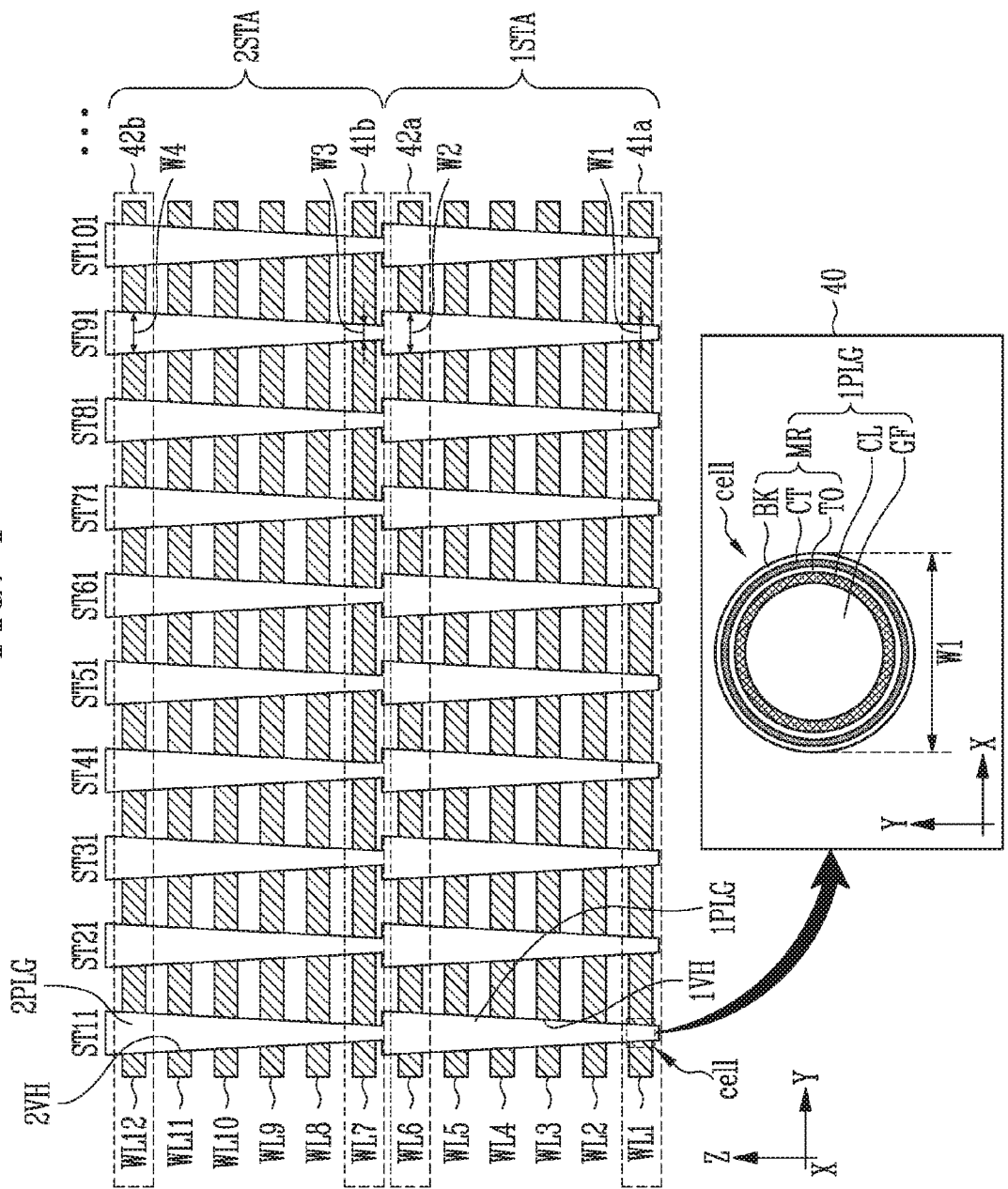
FIG. 4 is a diagram illustrating a memory block having a multi-stack structure.

FIG. 4 is a diagram illustrating a memory block having a multi-stack structure.

Referring to FIG. 4, a memory block having a multi-stack structure may have a structure in which a second stack 2STA is stacked on the top of a first stack 1STA. The first stack 1STA and the second stack 2STA may be distinguished from each other through a structural difference based on a method of manufacturing the memory block.

The first stack 1STA may include first to sixth word lines WL1 to WL6 which are stacked one on top of another while being spaced apart from each other along a Z direction, and first vertical plugs 1PLG which vertically penetrate the first to sixth word lines WL1 to WL6. The first vertical plugs 1PLG may be formed in first vertical holes 1VH vertically penetrating the first to sixth word lines WL1 to WL6. Because each first vertical hole 1VH is formed by sequentially etching portions of the first to sixth word lines WL1 to WL6, the difference between the widths of an upper portion and a lower portion of the first vertical hole 1VH may occur as the thickness of the first stack 1STA is larger or as the number of stacked word lines is larger. For example, as the time required for an etching process which forms the first vertical hole 1VH increases, the time during which the upper portion of the first vertical hole 1VH is exposed to etching gas becomes longer than that of the lower portion of the first vertical hole 1VH, and thus the width W2 of the upper portion of the first vertical hole 1VH may be formed to be greater than the width W1 of the lower portion of the first vertical hole 1VH.

Because memory cells are formed in each first vertical plug 1PLG, the width of the first vertical hole 1VH may also influence the sizes of the memory cells. For example, referring to an X-Y section 40 of each first vertical plug 1PLG, the first vertical plug 1PLG may include a gap-fill material GF formed therein in a cylindrical shape, and may include a channel layer CL and a memory layer MR which sequentially enclose the circumference of the gap-fill material GF. The channel layer CL may be a layer in which a channel is formed in the first vertical plug 1PLG, and in which electrons or charges may be moved through the channel. The memory layer MR may be a layer in which data is stored, and may include a tunnel insulating layer TO, a charge trap layer CT, and a blocking layer BK, which sequentially enclose the channel layer CL.

Therefore, the sizes of memory cells are determined depending on the width of the first vertical hole 1VH, and memory cells having different sizes may have different electrical characteristics.

The second stack 2STA may be formed on the top of the first stack 1STA including the first vertical holes 1VH. For example, the second stack 2STA may include seventh to twelfth word lines WL7 to WL12 which are sequentially stacked on the top of the first stack 1STA in which the first vertical holes 1VH are formed, and second vertical plugs 2PLG which vertically penetrates the seventh to twelfth word lines WL7 to WL12. The second vertical plugs 2PLG may be formed in second vertical holes 2VH vertically penetrating the seventh to twelfth word lines WL7 to WL12. Because each second vertical hole 2VH is formed by sequentially etching portions of the seventh to twelfth word lines WL7 to WL12, the difference between the widths of an upper portion and a lower portion of the second vertical hole 2VH may occur as the thickness of the second stack 2STA is larger or as the number of stacked word lines is larger. Although the lower portion of the second vertical hole 2VH is coupled to the upper portion of the corresponding first vertical hole 1VH, the lower portion of the second vertical hole 2VH has a width similar to that of the first vertical hole 1VH, and thus a width difference may occur in a region in which the first and second vertical holes 1VH and 2VH are in contact with each other. For example, when the width of the lower portion of the second vertical hole 2VH is a third width W3, the third width W3 may be less than the second width W2. Also, because the width of the upper portion of the second stack 2STA may be formed to be greater than the width W3 of the lower portion thereof, the upper portion of the second stack 2STA may have a fourth width W4 greater than the third width W3.

The memory cells may trap electrons in a program operation, and may discharge electrons in an erase operation, and thus the physical characteristics of the memory cells may be degraded as the program operation and the erase operation on the memory cells are repeated. For example, when the physical characteristics of the memory layer ML of the memory cells are degraded, any electrons trapped in the memory cells may not be discharged during an erase operation. As the number of trapped electrons increases in this way, the speed of the program operation or the erase operation on the memory cells may gradually decrease. In the present embodiment, such a phenomenon may be defined as the degradation of electrical characteristics.

As described above, differences between the widths of the first and second vertical plugs 1PLG and 2PLG may occur due to the characteristics of a manufacturing process, and the widths of vertical plugs formed in the lower portions of respective stacks may be formed to be less than those of vertical plugs formed in upper portions of the respective stacks. For example, in the first stack 1STA, assuming that the first vertical plugs 1PLG penetrating a region in which the first word line WL1 is formed have a first width W1, the first vertical plugs 1PLG penetrating a region in which the sixth word line WL6 is formed may have a second width W2 greater than the first width W1. In the second stack 2STA, assuming that the second vertical plugs 2PLG penetrating a region in which the seventh word line WL7 is formed have a third width W3 less than the second width W2, the second vertical plugs 2PLG penetrating a region in which the twelfth word line WL12 is formed may have a fourth width W4 greater than the third width W3. The first and third widths W1 and W3 may be different from or identical to each other depending on the manufacturing method, and the second and fourth widths W2 and W4 may also be different from or identical to each other depending on the manufacturing method.

A region in which the possibility that a defect will occur is strong may be adjusted based on the width of a vertical plug formed in a specific region. For example, when the region 42a or 42b having a large width is set as a reference region, the region 41a or 41b having a relatively small width may be set as a defect detection target. In contrast, when the region 41a or 41b having a small width is set as a reference region, the region 42a or 42b having a relatively large width may be set as a defect detection target. Further, when a middle region of each stack 1STA or 2STA is set as a reference region, the region 41a, 42a, 41b or 42b having a width less than or greater than that of the reference region may be set as a defect detection target.

Although, in FIG. 4, a memory block having a multi-stack structure is illustrated, the present embodiment may also be applied to a memory block having a single-stack structure.

Figure 5:
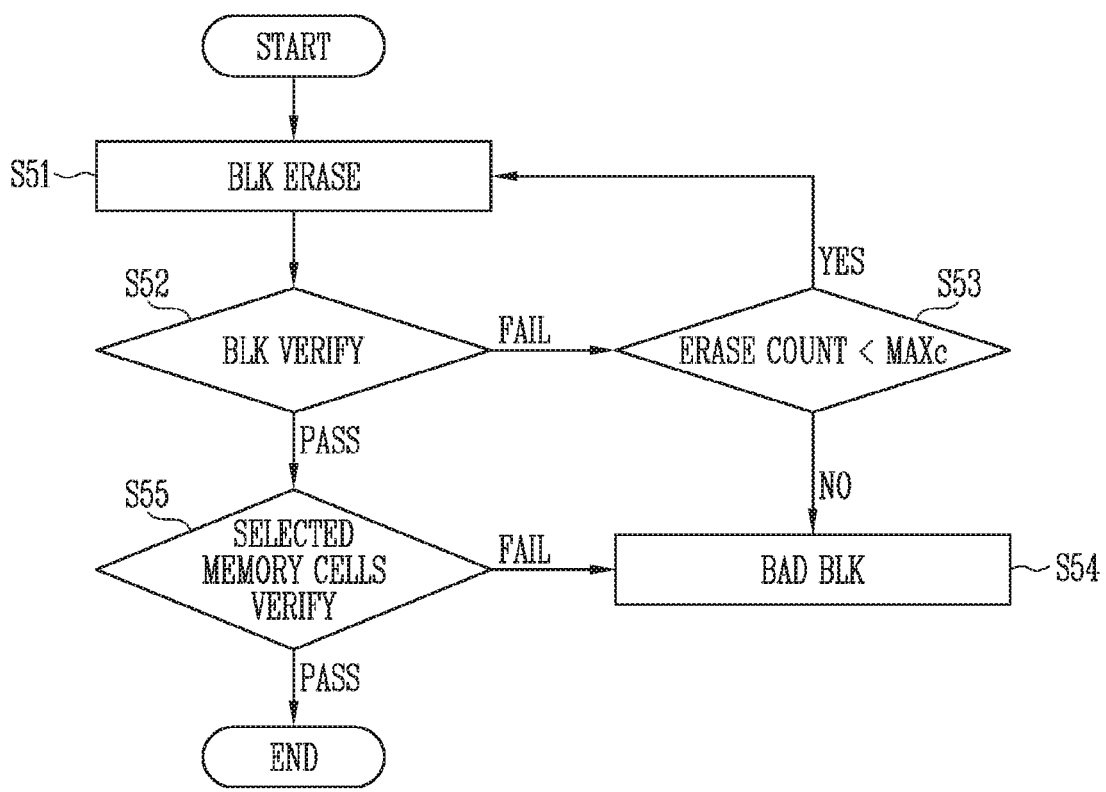
FIG. 5 is a flowchart illustrating an embodiment of a defect detection operation.
Figure 6:
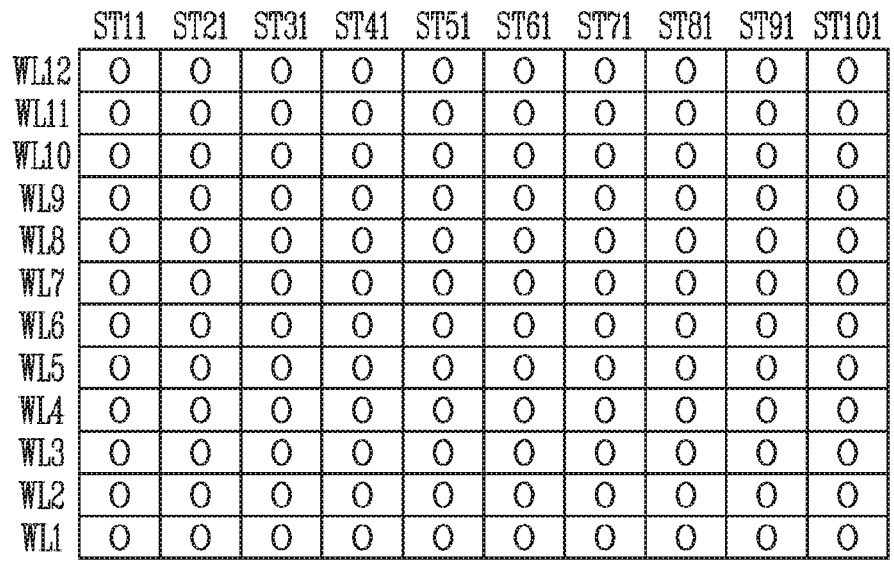
FIG. 6 is a diagram illustrating a block detection operation according to an embodiment of the present disclosure.
Figure 6:
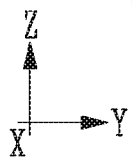
Figure 7:
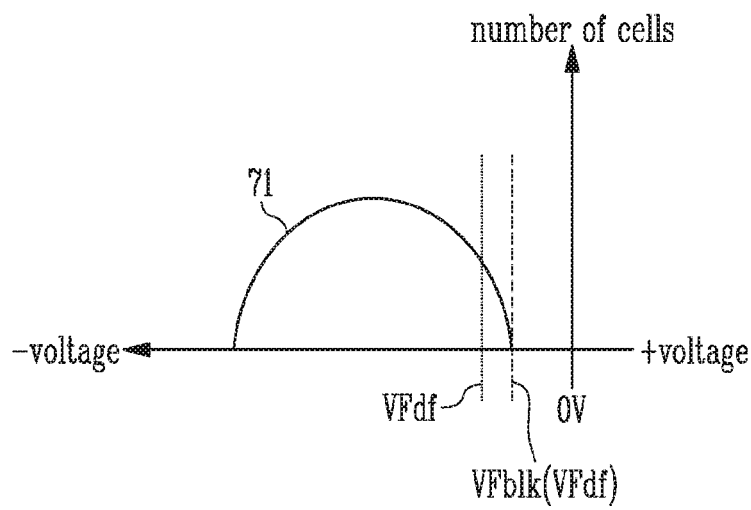
FIG. 7 is a diagram illustrating an erase verify voltage and a defect verify voltage.

FIGS. 5 to 7 are diagrams illustrating a defect detection operation according to an embodiment of the present disclosure.

FIG. 5 is a flowchart illustrating an embodiment of a defect detection operation, FIG. 6 is a diagram illustrating a block detection operation according to an embodiment of the present disclosure, and FIG. 7 is a diagram illustrating an erase verify voltage and a defect verify voltage.

Referring to FIGS. 5 to 7, the defect detection operation in the embodiment of the present disclosure may be performed after an erase operation has been performed. For example, control logic (e.g., 111 of FIG. 1) may perform a block erase operation on a selected memory block in response to an erase command and an address (BLK ERASE operation) at step S51. Here, the erase operation denotes an operation of decreasing the threshold voltages of all memory cells, included in the selected memory block, from an erase reference voltage. For example, the erase operation may be performed by applying an erase permission voltage (e.g., a ground voltage) to all word lines coupled to the selected memory block and applying an erase voltage to a bulk in which the selected memory block is formed or to a source line or bit lines coupled to the selected memory block. The erase voltage may be set to a positive voltage for decreasing the threshold voltages of programmed memory cells.

After the erase voltage has been applied to the selected memory block for a predetermined period of time, a block verify operation on the selected memory block may be performed (BLK VERIFY operation) at step S52.

Referring to FIG. 6, the block verify operation S52 may be simultaneously performed on all memory cells included in the selected memory block on which the erase operation has been performed. For example, when first to twelfth word lines WL1 to WL12 are coupled to eleventh to 101-st strings ST11 to ST101, the block verify operation S52 may be performed on all memory cells formed in a region in which the eleventh to 101-st strings ST11 to ST101 intersect the first to twelfth word lines WL1 to WL12. For example, the block verify operation may be performed by precharging all channels of the strings to a positive voltage and applying a block verify voltage to all of the word lines WL1 to WL12 coupled to the selected memory block. Here, the block verify voltage may be a voltage for determining whether the threshold voltages of the memory cells included in the selected memory block on which the block erase operation was performed have decreased to those in an erased state. For example, the block verify voltage may be set to a voltage lower than 0 V.

Referring to FIG. 7, a block verify voltage VFblk may be a voltage that is set so as to distinguish threshold voltages from a threshold voltage in a program state. During the block verify operation, when the threshold voltages of all memory cells included in the selected memory block become lower than the block verify voltage VFblk, the block verify operation S52 may pass. During the block verify operation, when at least one memory cell having a threshold voltage higher than the block verify voltage VFblk is detected, the block verify operation S52 may fail.

Referring back to FIG. 5, when the block verify operation has failed (in case of FAIL) at step S52, the control logic 111 may determine whether the number of erase operations, that is, ERASE COUNT, is less than the maximum number of erase operations, that is, the maximum erase count MAXc, at step S53. For example, the number of erase operations ERASE COUNT may be the number of times that an erase voltage is applied to the bulk of the selected memory block, the number times that the erase voltage is applied to the source line coupled to the selected memory block, or the number of times that the erase voltage is applied to bit lines coupled to the selected memory block. The maximum erase count MAXc may be the number of times that is set as a default in the memory device, and may be set so as to prevent erase operations from being infinitely performed.

When the erase count ERASE COUNT is less than the maximum erase count MAXc (in case of YES) at step S53, the block erase operation S51 may be re-performed. When the block erase operation is re-al performed, the erase voltage may be set to a voltage higher than a previous voltage.

When the erase count ERASE COUNT is equal to or greater than the maximum erase count MAXc (in case of NO) at step S53, the selected memory block may be processed as a bad block (BAD BLK) at step S54.

When the block erase operation has passed at step S52, a defect detection operation on the selected memory block may be performed at step S55.

The defect detection operation S55 may be performed in a way similar to that of the block verify operation S52, but voltages to be applied to the selected memory cells and the selected word lines may differ from those applied at step S52. For example, the defect detection operation S55 may be performed on selected memory cells included in the selected memory block. That is, the defect detection operation S55 may be performed on a page basis without being performed on all memory cells included in the selected memory block. Here, although the defect detection operation S55 is performed on a page basis, it may be performed on some selected pages without being performed on all pages included in the selected memory block. For example, the defect detection operation S55 may be selectively performed on selected pages, having differences in a physical structure compared to a reference region, in the selected memory block.

When the defect detection operation S55 has passed (in case of PASS) at step S55, the operation of erasing the selected memory block and the defect detection operation may be terminated. When the defect detection operation has failed (in case of FAIL) at step S55, the selected memory block may be processed as a bad block at step S54. For example, although the block verify operation S52 has passed on a page on which the possibility of growing defects occurring is strong, the page may be determined to have failed during a verify operation which is subsequently re-performed. That is, the memory cells included in the page selected in the defect detection operation S55 may have a strong possibility of failing in the defect detection operation S55. Although the defect detection operation S55 may be performed in various ways, it may be selectively performed on pages or strings in which the possibility of defects being detected is strong in the present embodiment. The pages or strings selected in the defect detection operation S55 will be described below.

FIGS. 8 to 10 are diagrams illustrating a detection operation performed on selected pages according to an embodiment of the present disclosure.

Referring to FIG. 8, during the defect detection operation S55, pages 41a and 41b corresponding to a region, in which the widths of vertical plugs included in the selected memory block are smallest, may be selected. Referring to the section of the memory block illustrated in FIG. 4, the widths of vertical plugs are formed to be smallest in the page 41a to which a first word line WL1 is coupled and the page 41b to which a seventh word line WL7 is coupled, and thus the defect detection operation S55 may be performed on memory cells coupled to the first and seventh word lines WL1 and WL7.

During the defect detection operation S55, a defect verify voltage may be applied to the selected first and seventh word lines WL1 and WL7, and a pass voltage may be applied to the remaining word lines. Here, the defect verify voltage (e.g., VFdf of FIG. 7) may be set to a voltage equal to the block verify voltage (e.g., VFblk of FIG. 7) or a voltage lower than the block verify voltage VFblk. The pass voltage may be set to a voltage that enables the memory cells coupled to the remaining word lines to be turned on and that is higher than the block verify voltage VFblk.

The defect detection operation S55 may be simultaneously performed on the selected pages, or may be performed while pages are sequentially selected. In order to shorten an operation time, the defect detection operation S55 may be simultaneously performed on the selected pages. That is, among the plurality of pages included in the selected memory block, only pages having the strongest possibility of defects occurring may be selectively verified, and thus the operation time may be shortened while growing defects may be detected in advance. Here, the growing defects denote defects that were not detected at the step of manufacturing a memory device, but may cause a bad block by gradually degrading electrical characteristics of memory blocks as the number of program and erase operations increases.

Referring to FIG. 9, the defect detection operation S55 may be performed on pages 41a and 41b formed in a region in which the widths of vertical plugs are smallest and on memory cells included one by one in different pages in the eleventh to 101-st strings ST11 to ST101. For example, the memory cells included one by one in different pages in the eleventh to 101-st strings ST11 to ST101 may be included in the remaining pages other than the pages 41a and 41b formed in a region in which the sizes of memory cells are smallest, and a cell included in one string may be selected from each page. For example, all of the memory cells coupled to the first word line WL1 may be selected, and only a memory cell included in a 21-st string ST21 may be selected from among the memory cells coupled to the second word line WL2. Only a memory cell included in a 31-st string ST31 may be selected from among the memory cells coupled to the third word line WL3. On the memory cells selected in this way, a defect detection operation may be performed. The memory cells coupled to the first and seventh word lines WL1 and WL7 may be determined to have passed or failed depending on the result of verification on the entirety of the corresponding page, but, each page from which only one memory cell is selected may be determined to have passed or failed depending on resulting data in a page buffer coupled to the corresponding string.

Referring to FIG. 10, during the defect detection operation S55, pages 41a and 41b in which the widths of vertical plugs are smallest and pages 42a and 42b in which the widths of vertical plugs are largest may be selected. Alternatively, pages in which the difference between the widths of vertical plugs is largest may be selected from among pages adjacent to each other.

For example, referring to the section of FIG. 4, when, in the page 42a to which the sixth word line WL6 is coupled, vertical plugs have a second width W2 and, in the page 41b to which the seventh word line WL7 is coupled, vertical plugs have a third width W3, the difference between the second width W2 and the third width W3 is largest in the selected memory block, and thus the defect detection operation S55 on the corresponding pages may be performed.

Figure 11:
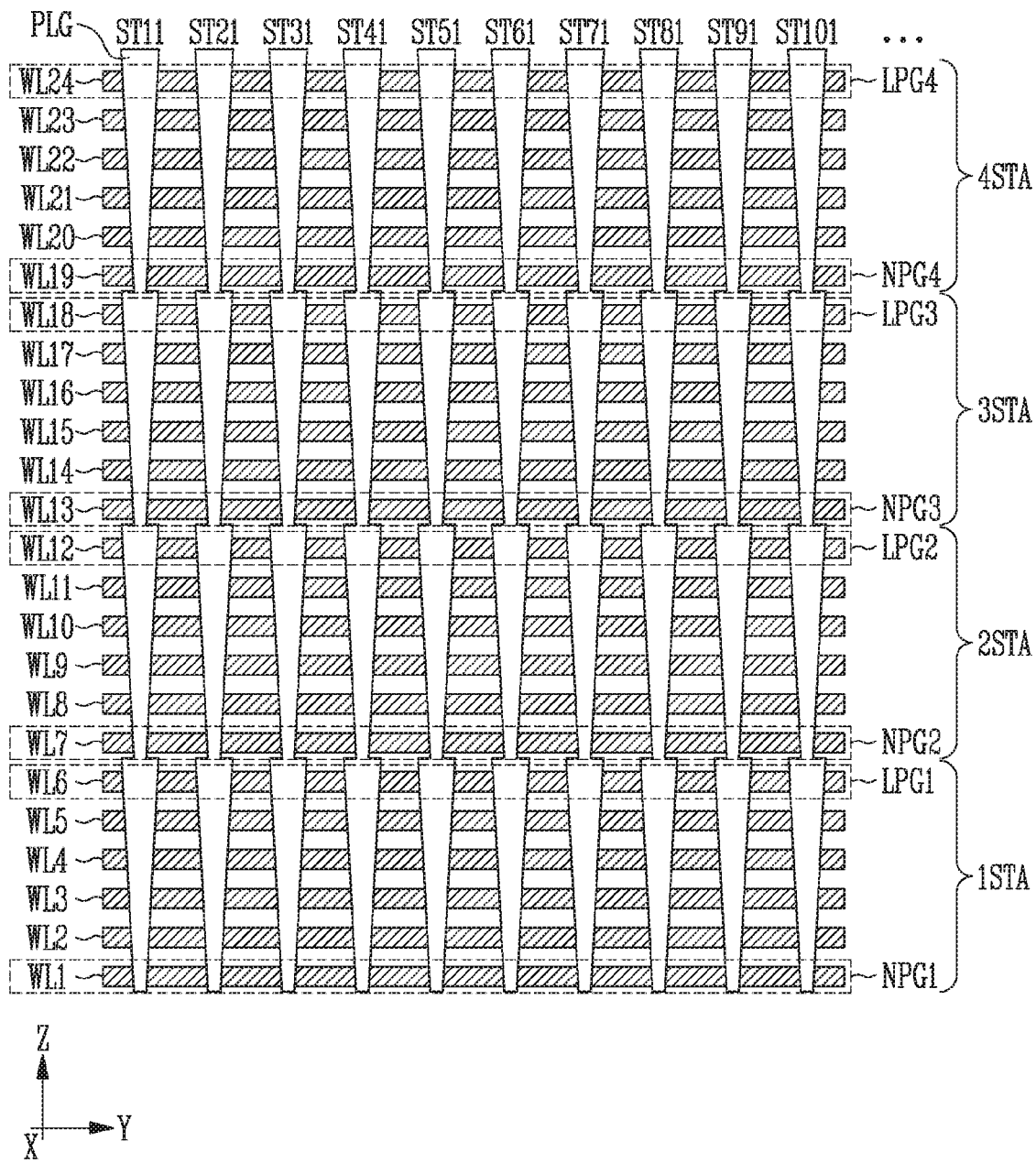
FIG. 11 is a diagram illustrating an example of a memory block having a multi-stack structure.

FIG. 11 is a diagram illustrating an example of a memory block having a multi-stack structure.

Referring to FIG. 11, even in a memory block for which the number of stacks stacked in a vertical direction (e.g., a Z direction) is larger than that of the multi-stack structure of FIG. 4, pages for a defect detection operation may be selected depending on the widths of vertical plugs. For example, in a memory block in which a first stack 1STA is formed on a substrate (not illustrated), and second to fourth stacks 2STA to 4STA are sequentially stacked on the first stack 1STA, the number of regions in which the difference between the widths of vertical plugs PLG is large may increase. For example, pages NPG1, NPG2, NPG3, and NPG4 to which first, seventh, thirteenth, and nineteenth word lines WL1, WL7, WL13, and WL19 are respectively coupled may be formed in a region in which the widths of the vertical plugs PLG are narrow. Further, pages LPG1, LPG2, LPG3, and LPG4 to which sixth, twelfth, eighteenth, and 24-th word lines WL6, WL12, WL18, and WL24 are respectively coupled may be formed in a region in which the widths of the vertical plugs PLG are wide.

Figure 12:
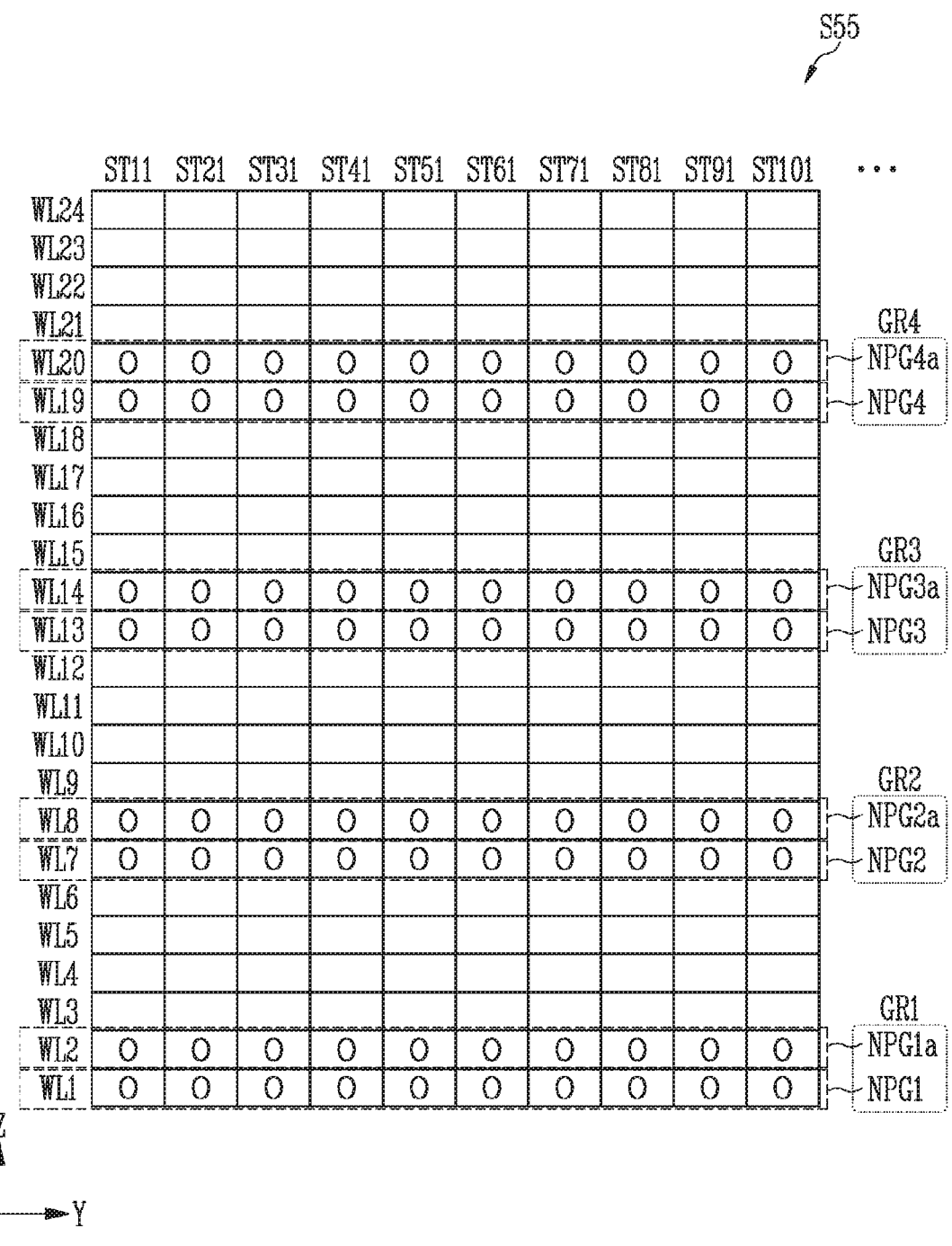
FIGS. 12 and 13 are diagrams illustrating an operation of detecting pages selected from the memory block illustrated in FIG. 11.
Figure 13:
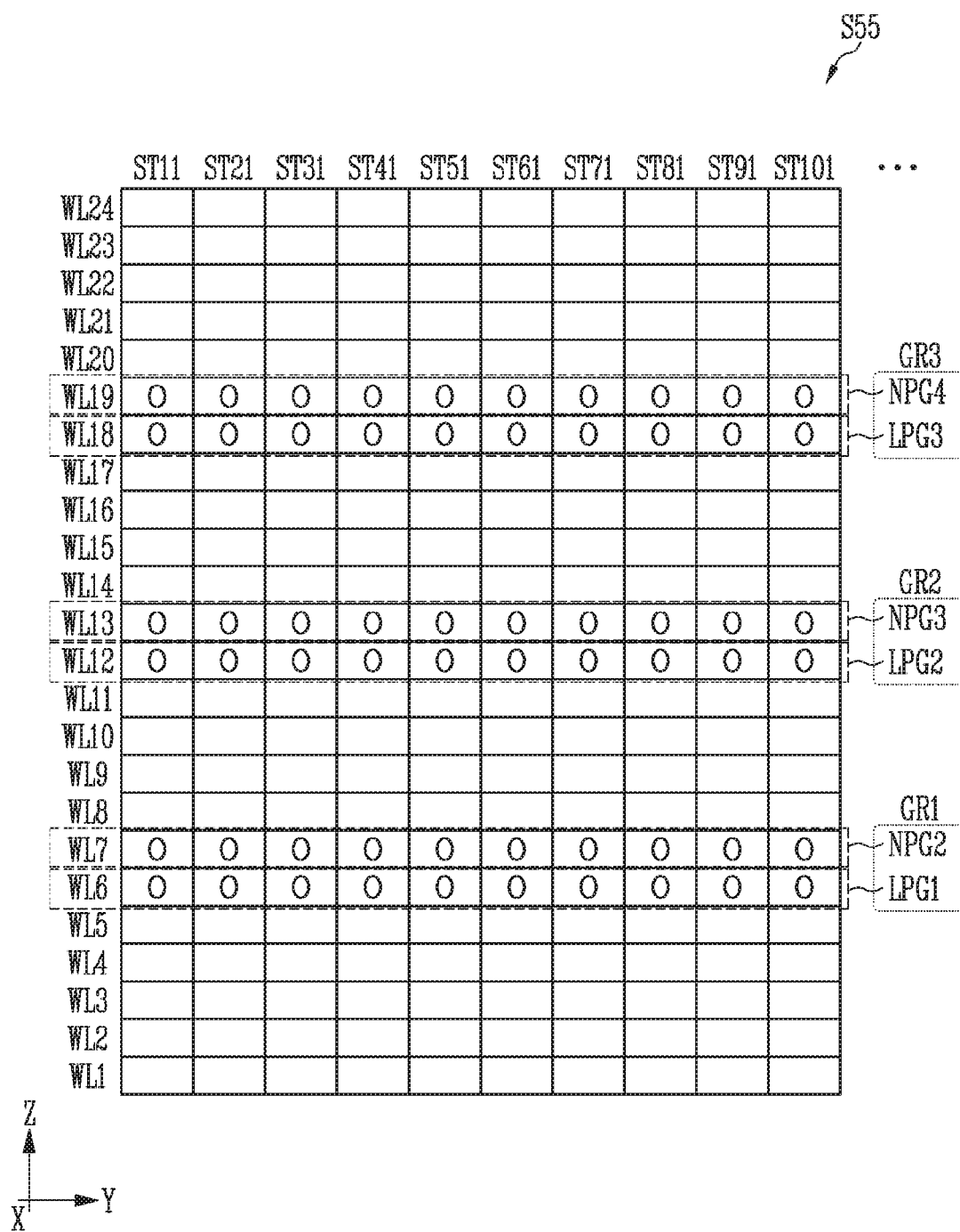

FIGS. 12 and 13 are diagrams illustrating a detection operation performed on pages selected from the memory block illustrated in FIG. 11.

Referring to FIG. 12, pages NPG1 to NPG4, in which the widths of vertical plugs (e.g., PLG of FIG. 11) are smallest, and pages NPG1a to NPG4a adjacent to the pages NPG1 to NPG4 may be set as groups. That is, because the possibility of growing defects occurring is high even in the pages NPG1a to NPG4a adjacent to the pages NPG1 to NPG4 formed in a region in which the widths of the vertical plugs are smallest, pages formed in the region in which the widths of the vertical plugs are smallest and a region adjacent thereto may be selected as groups GR1 to GR4 during a defect detection operation. For example, a first group GR1 may include pages NPG1 and NPG1a coupled to first and second word lines WL1 and WL2, a second group GR2 may include pages NPG2 and NPG2a coupled to seventh and eighth word lines WL7 and WL8, a third group GR3 may include pages NPG3 and NPG3a coupled to thirteenth and fourteenth word lines WL13 and WL14, and a fourth group GR4 may include pages NPG4 and NPG4a coupled to nineteenth and twentieth word lines WL19 and WL20.

During the defect detection operation S55, the first to fourth groups GR1 to GR4 may be simultaneously selected or may be sequentially selected. When the defect detection operation has failed in at least one of the first to fourth groups GR1 to GR4 when the first to fourth groups GR1 to GR4 are simultaneously selected, the selected memory block may be processed as a bad block. Alternatively, when a defect detection operation on the first group GR1 has passed in a case where the first to fourth groups GR1 to GR4 are sequentially selected, a defect detection operation on the second group GR2 may be performed. When the defect detection operation on the second group GR2 has failed, defect detection operations on the third and fourth groups GR3 and GR4 may be omitted, and the selected memory block may be processed as a bad block. That is, the selected memory block is not processed as a bad block only when all defect detection operations on the selected pages in the selected memory block have passed.

Referring to FIG. 13, pages included in a region in which the difference between the widths of vertical plugs (e.g., PLG of FIG. 11) is largest may be selected as groups. Pages formed in a region in which the widths of vertical plugs are smallest and a region in which the widths of vertical plugs are largest may be a single group, wherein the regions are adjacent to each other. Referring to the section illustrated in FIG. 11, because the difference between the widths of vertical plugs PLG that penetrate the sixth word line WL6 disposed in the uppermost portion of the first stack 1STA and the seventh word line WL7 disposed in the lowermost portion of the second stack 2STA is large, the page LPG1 coupled to the sixth word line WL6 and the page NPG2 coupled to the seventh word line WL7 may be set as a first group GR1. In this way, the pages LPG2 and NPG3 coupled to the twelfth and thirteenth word lines WL12 and WL13 may be set as a second group GR2, and pages LPG3 and NPG4 coupled to the eighteenth and nineteenth word lines WL18 and WL19 may be set as a third group GR3.

During the defect detection operation S55, the first to third groups GR1 to GR3 may be simultaneously selected, or may be sequentially selected. During the defect detection operation S55, a defect verify voltage VFdf may be applied to word lines coupled to a selected group or selected groups, and a pass voltage may be applied to unselected word lines. When all of defect detection operations on the first to third groups GR1 to GR3 have passed, the defect detection operation on the selected memory block may be terminated, whereas when the defect detection operation on at least one of the first to third groups GR1 to GR3 has failed, the selected memory block may be processed as a bad block.

Figure 14:
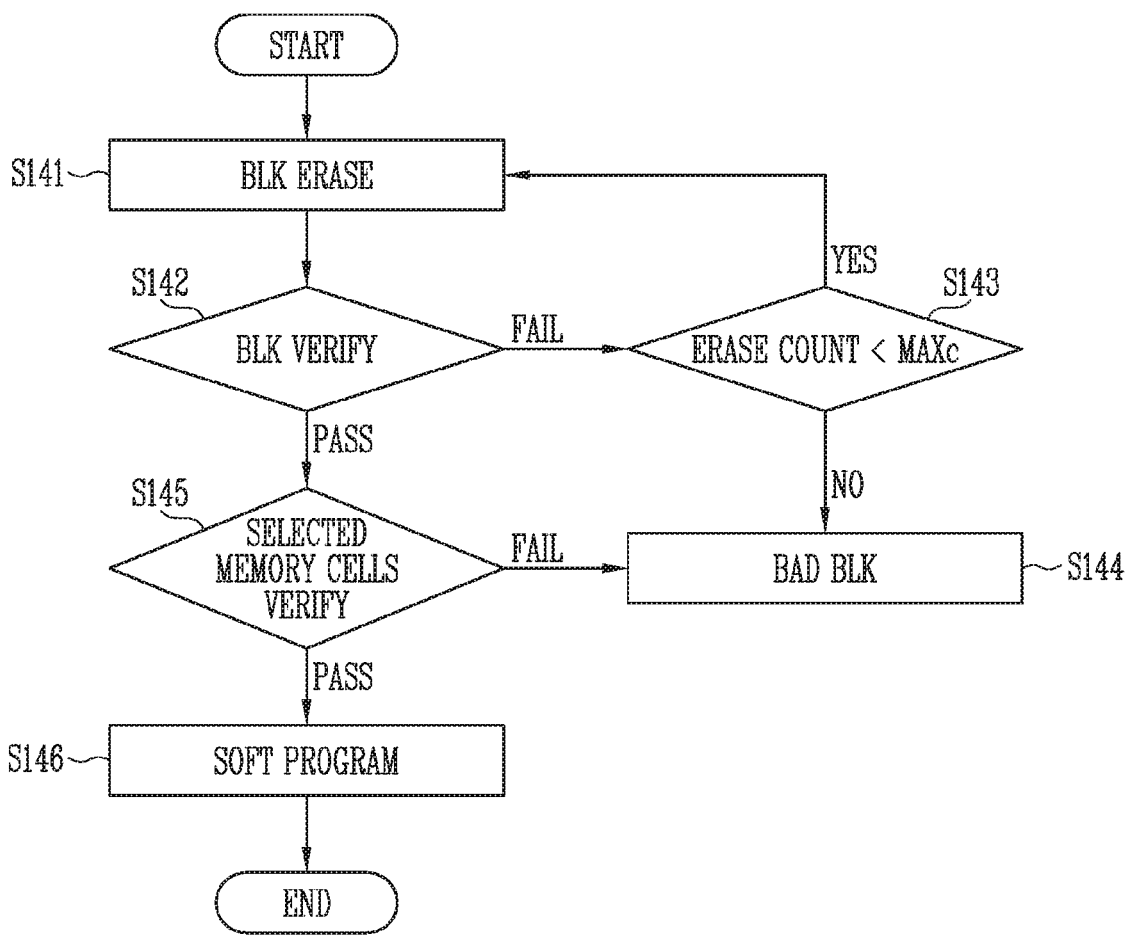
FIG. 14 is a diagram illustrating a defect detection operation according to an embodiment of the present disclosure.

FIG. 14 is a diagram illustrating a defect detection operation according to an embodiment of the present disclosure.

Referring to FIG. 14, control logic (e.g., 111 of FIG. 1) may perform a block erase operation on a selected block in response to an erase command and an address at step S141. Here, the erase operation denotes an operation of decreasing the threshold voltages of all memory cells, included in the selected memory block, from an erase reference voltage. For example, the erase operation may be performed by applying an erase permission voltage (e.g., a ground voltage) to all word lines coupled to the selected memory block and applying an erase voltage to a bulk in which the selected memory block is formed or to a source line or bit lines coupled to the selected memory block.

After the erase voltage has been applied to the selected memory block for a predetermined period of time, a block verify operation on the selected memory block may be performed at step S142.

The block verify operation S142 may be simultaneously performed on all memory cells included in the selected memory block on which the erase operation has been performed. For example, the block verify operation S142 may be performed by applying a block verify voltage to all word lines coupled to the selected memory block. Here, the block verify voltage may be a voltage for determining whether the threshold voltages of the memory cells included in the selected memory block on which the block erase operation was performed have decreased to those in an erased state. For example, the block verify voltage may be set to a voltage lower than 0 V so that threshold voltages are distinguished from a threshold voltage in a program state.

During the block verify operation S142, when the threshold voltages of all memory cells included in the selected memory block become lower than the block verify voltage, the block verify operation S142 may pass. When, during the block verify operation S142, when at least one memory cell having a threshold voltage higher than the block verify voltage is detected, the block verify operation S142 may fail.

When the block verify operation has failed (in case of FAIL) at step S142, the control logic 111 may determine whether the number of erase operations, that is, ERASE COUNT, is less than the maximum number of erase operations, that is, the maximum erase count MAXc, at step S143. For example, the number of erase operations ERASE COUNT may be the number of times that an erase voltage is applied to the bulk of the selected memory block, the number times that the erase voltage is applied to the source line coupled to the selected memory block, or the number of times that the erase voltage is applied to bit lines coupled to the selected memory block. The maximum erase count MAXc may be the number of times that is set as a default in the memory device, and may be set so as to prevent erase operations from being infinitely performed.

When the ERASE COUNT is less than the maximum erase count MAXc (in case of YES) at step S143, the block erase operation S141 may be re-performed. When the block erase operation is re-performed, the erase voltage may be set to a voltage higher than a previous voltage.

When the ERASE COUNT is equal to or greater than the maximum erase count MAXc (in case of NO) at step S143, the selected memory block may be processed as a bad block at step S144.

When the block erase operation has passed at step S142, a defect detection operation on the selected memory block may be performed at step S145.

Because the defect detection operation S145 may be performed on selected memory cells included in the selected memory block, and may be performed in the same way as the foregoing embodiments, repeated descriptions thereof will be omitted.

When the defect detection operation S145 has passed (in case of PASS) at step S145, a soft program operation of increasing the threshold voltages of drain and source select transistors included in the selected memory block may be performed at step S146. For example, during the soft program operation S146, drain and source select lines coupled to the selected memory block may be selected, and the soft program operation S146 may be performed by applying a soft program voltage to the selected drain and source select lines. Here, a pass voltage may be applied to all word lines coupled to the selected memory block. Also, when dummy cells are included in the selected memory block, the threshold voltages of the dummy cells may also increase during the soft program operation S146.

Figure 15:
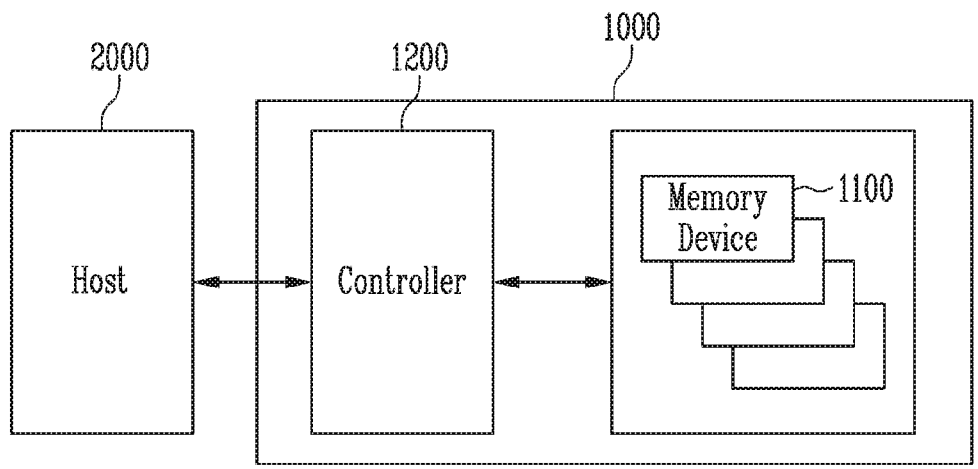
FIG. 15 is a diagram illustrating an embodiment of a memory system including a memory device according to an embodiment of the present disclosure.

FIG. 15 is a diagram illustrating an embodiment of a memory system including a memory device according to an embodiment of the present disclosure.

Referring to FIG. 15, a memory system 1000 may include a plurality of memory devices 1100 which store data, and a controller 1200 which performs communication between the memory devices 1100 and a host 2000.

Each of the memory devices 1100 may be a memory device, described in the foregoing embodiments.

The memory devices 1100 may be coupled to the controller 1200 through a plurality of system channels sCH. For example, the plurality of memory devices 1100 may be coupled to one system channel sCH, and a plurality of system channels sCH may be coupled to the controller 1200.

The controller 1200 may perform communication between the host 2000 and the memory devices 1100. The controller 1200 may control the memory devices 1100 in response to a request from the host 2000, or may perform a background operation for improving the performance of the memory system 1000 regardless of a request from the host 2000.

The host 2000 may generate requests for various operations, and may output the generated requests to the memory system 1000. For example, the requests may include a program request for controlling a program operation, a read request for controlling a read operation, an erase request for controlling an erase operation, etc. The host 2000 may communicate with the memory system 1000 through various interfaces, such as Peripheral Component Interconnect Express (PCIe), Advanced Technology Attachment (ATA), Serial ATA (SATA), Parallel ATA (PATA), serial attached SCSI (SAS), Non-Volatile Memory Express (NVMe), Universal Serial Bus (USB), Multi-Media Card (MMC), Enhanced Small Disk Interface (ESDI), or Integrated Drive Electronics (IDE).

Figure 16:
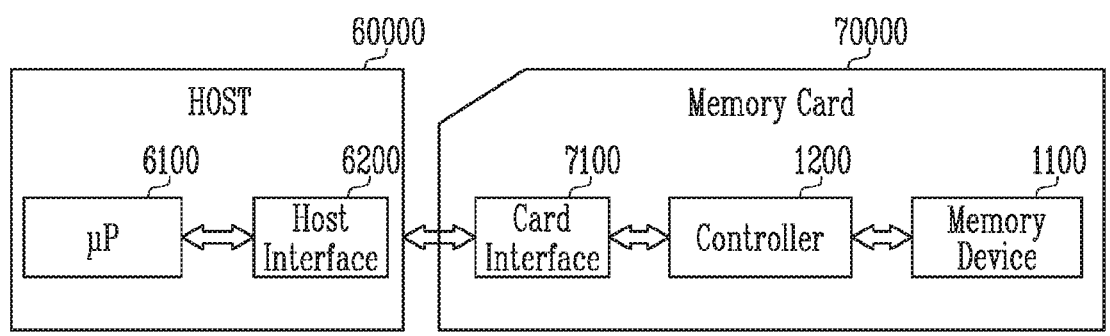
FIG. 16 is a diagram illustrating an embodiment of a memory system including a memory device according to an embodiment of the present disclosure.

FIG. 16 is a diagram illustrating an embodiment of a memory system including a memory device according to an embodiment of the present disclosure.

Referring to FIG. 16, the memory system may be implemented as a memory card 70000. The memory card 70000 may include a memory device 1100, a controller 1200, and a card interface 7100.

The controller 1200 may control data exchange between the memory device 1100 and the card interface 7100. In an embodiment, the card interface 7100 may be, but is not limited to, a secure digital (SD) card interface or a multimedia card (MMC) interface.

The card interface 7100 may interface data exchange between a host 60000 and the controller 1200 according to a protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method supported by the card interface 7100.

When the memory system 70000 is coupled to a host interface 6200 of the host 60000 such as a PC, a tablet PC, a digital camera, a digital audio player, a mobile phone, console video game hardware or a digital set-top box, the host interface 6200 may perform communication with the memory device 1100 through the card interface 7100 and the controller 1200 under the control of a microprocessor (μP) 6100 of the host 60000.

The present disclosure is directed to detecting defects occurring in a memory device during the operation of the memory device, thus detecting defects occurring in the memory device even after a product including the memory device has been shipped.

What is claimed is:

1. A memory device, comprising:
   a memory block including a plurality of memory cells that are stacked to be spaced apart from each other on a substrate, including word lines coupled to the plurality of memory cells, and including bit lines and a source line coupled to both ends of strings which include the plurality of memory cells; and
   peripheral circuits configured to perform an erase operation on the memory block,
   wherein the peripheral circuits are configured to perform the erase operation on the plurality of memory cells included in the memory block, and thereafter to perform a defect detection operation on selected memory cells selected from among the plurality of memory cells depending on sizes of the plurality of memory cells, and
   wherein the selected memory cells have a gradually degrading electrical characteristic as a number of erase operations increases,
   wherein the plurality of memory cells are formed in vertical plugs that vertically penetrate the plurality of word lines, and
   wherein the sizes of the plurality of memory cells are based on widths of the vertical plugs.

2. The memory device according to claim 1, wherein the peripheral circuits comprise:
   a voltage generator configured to supply operating voltages to the word lines and the source line;
   page buffers configured to store data by receiving voltages or currents that are changed depending on the selected memory cells through the bit lines; and
   control logic configured to control the voltage generator and the page buffers in response to a command and an address.

3. The memory device according to claim 2, wherein the control logic is configured to, in response to the command and the address:
   control the voltage generator and the page buffers so that the erase operation is performed; and
   control the voltage generator and the page buffers so that, after the erase operation has been performed, the defect detection operation is performed by applying a defect verify voltage to selected word lines coupled to the selected memory cells.

4. The memory device according to claim 3, wherein the control logic is configured to, when the erase operation is performed:
   perform a block erase operation on an entirety of the memory block;
   perform a block verify operation on the entirety of the memory block; and
   repeat the block erase operation and the block verify operation until the block verify operation passes.

5. The memory device according to claim 4, wherein the control logic is configured to, when the block verify operation is performed, determine whether the block verify operation has passed or failed by applying a block verify voltage to all of the word lines coupled to the plurality of memory cells.

6. The memory device according to claim 3, wherein the control logic is configured to, when the defect detection operation is performed:
   precharge potentials of channels included in the strings to a positive voltage;
   apply the defect verify voltage to the selected word lines;
   apply a pass voltage to unselected word lines other than the selected word lines; and
   determine, depending on the potentials of the channels, whether the defect detection operation has passed or failed.

7. The memory device according to claim 6, wherein the control logic is configured to:
   determine, when cells having threshold voltages higher than the defect verify voltage are detected among the selected memory cells, that the defect detection operation has failed; and
   determine, when all of threshold voltages of the selected memory cells are lower than the defect verify voltage, that the defect detection operation has passed.

8. The memory device according to claim 7, wherein the control logic is configured to process, when the defect detection operation fails, the memory block as a bad block.

9. The memory device according to claim 7, wherein the control logic is configured to terminate, when the defect detection operation passes, the erase operation on the memory block.

10. The memory device according to claim 9, wherein the control logic is configured to control, before the erase operation on the memory block is terminated, the voltage generator and the page buffers so that a soft program operation of increasing threshold voltages of select transistors included in the memory block is further performed.

11. The memory device according to claim 1, wherein the selected memory cells are formed in a region in which the widths of the vertical plugs are smallest.

12. The memory device according to claim 11, wherein, during the defect detection operation, the peripheral circuits are configured to select a group of memory cells in the region in which the widths of the vertical plugs are smallest and in an adjacent region.

13. The memory device according to claim 1, wherein, during the defect detection operation, the peripheral circuits are configured to select a group of memory cells in a region in which a difference between the widths of the vertical plugs is largest.

14. The memory device according to claim 1, wherein the selected memory cells are formed in a region in which the widths of the vertical plugs are largest.

15. A method of operating a memory device, comprising:
performing an erase operation and a block verify operation on a memory block;
performing, when a result of the block verify operation is a pass, a defect detection operation on pages selected from among a plurality of pages included in the memory block; and
processing, when the result of the block verify operation is a failure or a result of the defect detection operation is a failure when a number of erase operations is a maximum erase count, the memory block as a bad block.

16. The method according to claim 15, wherein the defect detection operation comprises:
precharging channels of strings included in the memory block to a positive voltage;
applying a defect verify voltage to word lines coupled to the selected pages; and
determining whether the defect detection operation has passed or failed by measuring voltages or currents of bit lines coupled to the strings.

17. The method according to claim 15, wherein the selected pages are set to pages coupled to a region in which widths of vertical plugs included in the memory block are formed to be largest.

18. The method according to claim 15, wherein the selected pages are set to pages coupled to a region in which a difference between widths of vertical plugs included in the memory block is largest.

* * * * *